(12) United States Patent
Houde-Walter et al.

(10) Patent No.: US 10,411,431 B2
(45) Date of Patent: Sep. 10, 2019

(54) INFRARED LASER SYSTEM

(71) Applicant: LaserMax, Inc., Rochester, NY (US)

(72) Inventors: Susan Houde-Walter, Rush, NY (US); Brian L. Olmsted, Spencerport, NY (US); Jeffrey W. Mock, Rochester, NY (US); John A. Kowalczyk, Jr., Fairport, NY (US); Jeffrey D. Tuller, Rochester, NY (US)

(73) Assignee: LMD Power of Light Corporation, Rochester, NY (US)

( * ) Notice: Subject to any disclaimer, the term of this patent is extended or adjusted under 35 U.S.C. 154(b) by 0 days.

(21) Appl. No.: 15/348,646

(22) Filed: Nov. 10, 2016

(65) Prior Publication Data

US 2017/0141534 A1 May 18, 2017

Related U.S. Application Data

(60) Provisional application No. 62/254,181, filed on Nov. 12, 2015.

(51) Int. Cl.
*H01S 5/022* (2006.01)
*H04B 10/11* (2013.01)
*G08B 21/02* (2006.01)

(52) U.S. Cl.
CPC .......... *H01S 5/02212* (2013.01); *H04B 10/11* (2013.01); *G08B 21/0252* (2013.01); *H01L 2224/48091* (2013.01); *H01L 2224/48247* (2013.01); *H01S 2301/20* (2013.01)

(58) Field of Classification Search
CPC ...... H01S 5/042; H01S 5/02296; H01S 5/022; H01S 5/2036; H01S 5/34313; H01S 5/22; H01S 5/34306; H01S 5/0282; G01P 15/00; G08B 21/0252; G02B 6/4292
See application file for complete search history.

(56) References Cited

U.S. PATENT DOCUMENTS

| | | | | |
|---|---|---|---|---|
| 4,757,197 A * | 7/1988 | Lee | .......................... | H01S 5/026 250/239 |
| 5,400,514 A * | 3/1995 | Imbrie | ................. | G01C 15/002 33/286 |
| 5,999,550 A * | 12/1999 | Bellemore | .............. | H01S 5/042 372/38.02 |
| 2004/0091341 A1* | 5/2004 | Blattner | .............. | G03F 7/70741 414/331.01 |
| 2007/0121689 A1* | 5/2007 | Brown | .................... | H01S 3/025 372/39 |

(Continued)

*Primary Examiner* — Xinning(Tom) Niu
(74) *Attorney, Agent, or Firm* — Lee & Hayes, P.C.

(57) ABSTRACT

Laser systems are provided with a semiconductor laser having an emission face, a drive circuit adapted to supply electric energy to the semiconductor laser to cause the semiconductor laser to emit a beam; a user input system adapted to sense a user input action; a controller adapted to control the drive circuit based upon the sensed user input action; a housing within which the laser is positioned and having an opening with a window through which the semiconductor laser can emit the beam. The semiconductor laser is positioned to emit the beam through the window and the emission face of the semiconductor laser is sized to cause a divergence in the beam to create a patterned emission with a predetermined shape without passing the beam through beam shaping optics.

20 Claims, 5 Drawing Sheets

(56) References Cited

U.S. PATENT DOCUMENTS

2008/0074962 A1\* 3/2008 Toyoda .................. G11B 7/127
                                                    369/44.11
2009/0302881 A1\* 12/2009 Sedlacik ............. H01S 5/02212
                                                    324/750.03

\* cited by examiner

INFRARED LASER SYSTEM

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A "SEQUENCE LISTING"

Not applicable.

FIELD OF THE INVENTION

The present invention relates to laser systems, and more particularly to laser systems usable to create wide area emissions such as may be suitable for a laser beacon system.

BACKGROUND OF THE INVENTION

Rescue and identification beacons that do not emit radio frequency signals are of particular interest in applications where radio frequency communications may be difficult to establish and maintain, where electronic interference or absorption prevents reliable communication, or where detection and interception of such signals may be problematic.

One way to meet these requirements is to use portions of the electromagnetic spectrum that include infrared light. However, there are a number of challenges associated with providing beacons of this type. Meeting size and weight constraints is critical to the success of such laser systems as these constraints impact the extent to which such devices are practically portable or hand-held. Additionally, such systems must be survivable in portable applications and must be capable of extended operation. Such requirements can significantly be perceived as having contradictory implications, with a desire for small size and light weight operation being contrary to the requirement of ruggedness which requires extras weight and size and the requirement of extended operation requiring significant power supplies which can add weight and volume again increasing challenges associated with providing for the desired ruggedness.

Further, systems that are highly complex or that require precise placement of and alignment of optical and electronic instruments tend to be more vulnerable to damage through incidental contact, thermal extremes, or other damage that may occur during operation. This again raises the requirements for the ruggedness of the system.

What is needed therefore is a small, portable, light weight, laser system that can generate appropriate signals without requiring precise placement of optical components.

Further, such a laser system should be designed to avoid unnecessary emission of non-radio frequencies in ways that might allow detection or interception of the emissions while allowing movement of the person.

Finally, the laser system must be easily used with any interactions with the system designed to enable, rapid confident use by field operatives who may be distracted, injured, under fire and who may be wearing gloves or other protective equipment.

SUMMARY OF THE INVENTION

In aspects laser systems are provided with a semiconductor laser having an emission face, a drive circuit adapted to supply electric energy to the semiconductor laser to cause the semiconductor laser to emit a beam; a user input system adapted to sense a user input action; a controller adapted to control the drive circuit based upon the sensed user input action; a housing within which the laser is positioned and having an opening with a window through which the semiconductor laser can emit the beam. The semiconductor laser is positioned to emit the beam through the window and the emission face of the semiconductor laser is sized to cause a divergence in the beam to create a patterned emission with a predetermined shape without passing the beam through beam shaping optics.

In other aspects, a laser system is provided having a semiconductor laser having an emission face; a drive circuit adapted to supply electric energy to the semiconductor laser to cause the semiconductor laser to emit a beam; a user input system adapted to sense a user input action; a controller adapted to control the drive circuit based upon the sensed user input action; and a housing having a first housing part within which at least the semiconductor laser is positioned and having a second part joined to the first housing part and having a housing window through the beam can pass. The first housing part is movable within a range of positions relative to the second housing part and wherein the emission face of the semiconductor laser has an area that causes a divergence in the beam that creates a patterned emission with a predetermined shape that does not substantially change with relative movement of the first housing part and the second housing part and without passing the beam through beam shaping optics.

BRIEF DESCRIPTION

DETAILED DESCRIPTION OF THE DRAWINGS

Unless stated otherwise herein, the drawings are not necessarily to scale.

Figure 1:
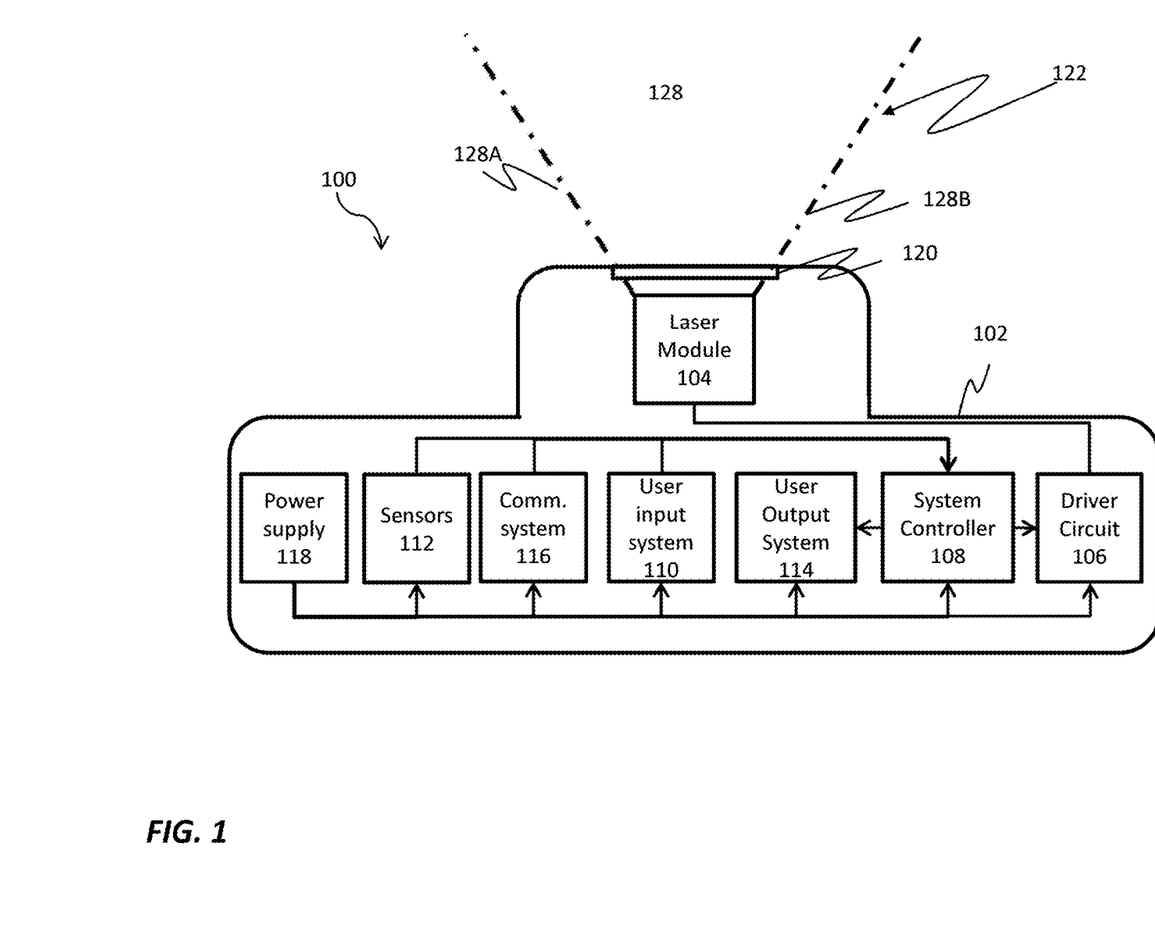
FIG. 1 is a schematic view of a first embodiment of a laser system.
Figure 2:
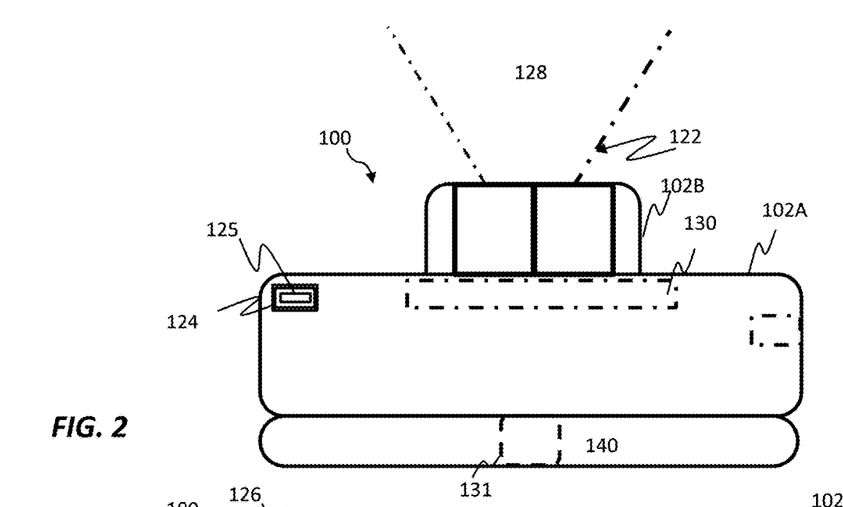
FIG. 2 is a side view of one embodiment of the laser system of FIG. 1.
Figure 3:
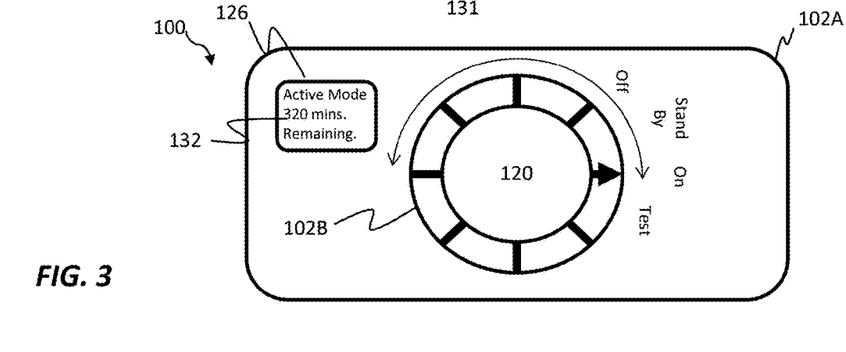
FIG. 3 is a top view of the embodiment of FIG. 2.

FIG. 1 is a schematic view of first embodiment of a laser system 100. FIGS. 2 and 3 illustrate respectively top and end views of the embodiment of FIG. 1. In the embodiment illustrated in FIGS. 1-3 laser system 100 has a system housing 102 that encompasses, substantially encloses, or otherwise retains, a laser module 104, a drive circuit 106, a system controller 108, a user input system 110, sensors 112, a user output system 114, a communication system 116, and a power supply 118.

In this embodiment, system controller 108 receives signals from user input system 110, sensors 112, and communication system 116 and determines whether a response to such signals is required. When system controller 108 determines to respond to received signals by causing a laser emission, system controller 108 sends signals to drive circuit 106 causing drive circuit 106 to supply electrical energy from power supply 118 to laser module 104 in a manner that causes laser module 104 to emit a beam of laser emission 122. System controller 108 can also generate signals that cause user output system 114 to generate a human perceptible output. Additionally, system controller 108 can send signals to communication system 116 causing communication system 116 to send signals to other devices, to cause communication system 116 to receive signals from other devices or both. Power supply 118 provides electrical energy to drive circuit 106, system controller 108, user input system 110, sensors 112, user output system 114, and communication system 116. As is shown in FIGS. 1-3, in this embodiment system housing 102 provides an enclosure for each of the components of laser system 100 to provide an enclosed a stand-alone device capable of laser emission.

System housing 102 can be formed of any of a variety of rigid materials such as composites, laminates, plastics or metals. In one configuration, system housing 102 can be formed of an extruded aluminum, thereby providing sufficient strength without requiring significant weight while also providing good thermal transfer properties. System housing 102 can be fabricated or assembled in any of a variety of ways. In one embodiment, system housing 102 is machined such as by EDM (electrical discharge machining), assembled, or molded if composites, laminates, plastics or metals are employed for system housing 102. System housing 102 also can be fabricated using other conventional techniques including but not limited to additive assembly techniques.

In the embodiment illustrated in FIGS. 1-3 housing 102 has a first housing portion 102A and a second housing portion 102B that are joined in a manner that allows rotation of first housing portion 102A and second housing portion 102B relative to each other.

In FIGS. 1-3, first housing portion 102A is generally rectangular while second housing portion 102B is generally cylindrical. However, in other exemplary embodiments, system housing 102 may be configured to provide surfaces that enable system housing 102 to be joined, fixed, held, mounted or otherwise positioned for movement by personnel, such as being carried manually or in holsters, helmets, or other bodily worn equipment. System housing 102 can also be joined to weapon systems such as a hand-held weapon system or to any of a variety of direct fire weapons such as handheld, side, and small firearms. Such firearms include, but are not limited to, pistols, rifles, shotguns, automatic arms, semi-automatic arms, rocket launchers and select grenade launchers bows. In other embodiments, system housing 102 can be configured to mount any known dismounted or dismounted crew-served weapon, including but not limited to machine guns, artillery, recoilless rifles and other types of crew served weapons. In still other embodiments, system housing 102 can be shaped, sized or otherwise provided in forms that more readily interface with any of a variety of clamping or mounting mechanisms including but not limited to a Weaver-style Picatinny rail or dove tail engagement for mounting to these firearms. In further exemplary embodiments, system housing 102 can be configured as a component part of a hand-held weapon system 12 or other direct fire weapon, such as a foregrip, sight or stock.

System housing 102 may be joined to medical equipment or any other stationary or movable equipment. Additionally, system housing 102 may be connected to or integrated into moving or movable vehicles such as ground, air, sea or other movable objects.

Drive circuit 106 receives power from power supply 118 and control inputs from system controller 108. In response to the control inputs received from system controller 108, drive circuit 106 generates signals that cause laser module 104 to emit laser light. In the embodiment that is illustrated in FIG. 1 laser module 104 is not directly connected to power supply 118 but rather receives power by way of drive circuit 106 such that drive circuit 106 can control the time, duration, and intensity of electrical energy supplied to laser module 104. Drive circuit 106 may be configured to assist in tuning and/or otherwise controlling the output of laser module 104. Drive circuit 106 can be constructed to provide either pulsed or continuous operation of laser module 104. The rise/fall time of the pulse, compliance voltage and current generated by drive circuit 106 for the laser module 104 are selected based at least in part upon power consumption, heat generation and desired beam intensity considerations. These parameters may also be selected to cause laser module 104 to produce a beam having a desirable wavelength, frequency, transverse mode number and/or other quantifiable characteristics.

Depending on the desired output, drive circuit 106 can enable operation of the laser module 104 as a continuous or pulsed laser, such as by passive, active, or controlled switching. Although specific values depend upon the particular laser module 104 and intended operating parameters, it is contemplated the peak power draw of drive circuit 106 may be between approximately 1 amp and approximately 10 amps, with an average current draw between approximately 0.1 amps and approximately 1.0 amps. As the required voltage may be between on average approximately 9 volts and approximately 12 volts, approximately 0.9 W to approximately 12 W may be consumed. This may represent a substantial power consumption as well as heat generation.

In an exemplary embodiment, drive circuit 106 may assist in controlling and/or modifying the power level of laser module 104 to aid in penetrating components or conditions of the atmosphere through which laser system 100 will direct laser emission 122. Such components or conditions may include, for example, snow, rain, fog, smoke, mist, clouds, wind, dust, gas, sand, and/or other known atmospheric or airborne components. For example, drive circuit 106 can be configured to controllably, manually, and/or automatically increase the current and/or voltage directed to strengthen and/or intensify laser emission 122 emitted by laser module 104 in such conditions.

It is also understood that laser module 104 can have more than one semiconductor laser 180. In one exemplary embodiment of this type, a laser module 104 can have one semiconductor laser 180 in the form of a mid-range adapted infrared quantum cascade laser and another semiconductor laser 180 in the form of a long-range adapted infrared quantum cascade laser. Other combinations of semiconductor lasers 180 are possible.

Alternatively, in other embodiments, laser module 104 can include components that can receive signals from drive circuit 106 and that can adjust power supplied to semiconductor laser 180 in response to such signals. In such an alternative embodiment, laser module 104 may receive electrical energy directly from power supply 118.

In the embodiment illustrated in FIGS. 1-3 system housing 102 has plurality of openings shown as openings 120, 124 and 126. In certain embodiments, seals (not shown) can be supplied at openings 120, 124 and 126 to provide a barrier to resist entry of contaminants so as to protect the components disposed within system housing 102 from water, dust, vapors, or other harmful contaminants commonly experienced in non-controlled environment use. Optionally, system housing 102 can be hermetically sealed, at least in part around laser module 104.

User input system 110 includes human operable sensors such as switches, touch pads, joysticks, audio, video, keypads, key locks, proximity sensors or any other known types of sensors that can detect a user input action and that can provide signals to system controller 108 indicative of the user input action. In the embodiment of FIGS. 1-3, user input system 110 provides a switch 130 that takes the form of a four position mode switch with different settings to enable manual selection of three different operating mode selections and an off selection.

Sensors 112 can include any form of device that can be used to detect or otherwise sense conditions inside or outside of system housing 102 that may be useful to system controller 108 in determining actions to be taken in operating laser system 100. Sensors 112 can include without limitation, light sensors such as photovoltaic cells, contact switches, opto-electronic sensors such as light beam emitter and sensor pairs, electro-mechanical sensors such as limit switches, strain sensors, and proximity sensors such as Hall-effect sensors, thermal sensors, meteorological sensors, such as humidity sensors, accelerometers, orientation sensors and other known sensors and transducers.

User output system 114 can include, without limitation actuators, light emitters, video displays, or other sources of human perceptible visual, audio or tactile signals from which a user can determine for example, and without limitation, a status of laser system 100, an operating mode of laser system 100, or that laser system 100 is emitting a laser emission 122 and a characteristics of the laser emission 122 that laser system 100 is emitting or will emit when instructed to do so. In this embodiment, user output system 114 optionally includes a video display 132 that is positioned in opening 126.

Communication system 116 can include any combination of known communication circuits including wired or wireless transponders, transceivers, transmitters, receivers, antennas, modulators, de-modulators, encryption and de-encryption circuits or software and can provide other known components to facilitate data communication, the exchange of control signals or power exchanges in wired or wireless form.

Power supply 118 is shown located within system housing 102. In one configuration, power supply 118 comprises a battery and system housing 102 can include a battery compartment (not shown) sized to operably receive and retain a power supply 118 in the form of batteries. Depending upon the anticipated power requirements, available space, and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with laser system 100. The battery-type power supply 118 can be disposable or rechargeable. Battery compartment can be formed of a weather resistant, resilient material such as plastic, and shaped to include receptacles for receiving one or more batteries or other power storage devices. Further, the battery compartment may be selectively closeable or sealable to prevent environmental migration into the compartment or to create a hermetically sealed environment therein.

In other exemplary embodiments, power supply 118 can take the form of a fuel cell, capacitive system or other portable electrical energy storage or generation system. It is understood that any type of power supply 118, preferably portable and sufficiently small in size can be utilized.

As is noted above, system controller 108 drives operation of laser system 100 and receives signals from user input system 110, sensors 112 and communication system 116 that system controller 108 can use to control operation of laser system 100. System controller 108 comprise for example a computer, a microprocessor, micro-controller, programmable analog logic device or a combination of programmable or hardwired electronic devices capable of performing the functions and actions described or claimed herein.

In the embodiment of FIGS. 1-3 system controller 108 determines a mode of operation of laser system 100 in response to a signal from a switch 130 (shown in phantom in FIG. 2) which is a component of user input system 110. In this embodiment, switch 130 senses a condition indicative of the relative rotation of Switch 130 may be mechanical, electromechanical, optical, electro-optical, magnetic or Hall-effect type or any other type capable of sensing rotation of first housing portion 102A and second housing portion 102B.

In this embodiment, when switch 130 detects that relative rotation of first housing portion 102A and second housing portion 102B to an "off" orientation user input system 110 sends signals to system controller 108, allowing system controller 108 to generate signals or to stop generating signals so that laser system 102 will remain in an inactive state or a low power consumption mode of operation.

However, when system controller 108 receives signals from user input system 110 indicating that second housing portion 102B is rotated to an "on position" "On" position system controller 108 can generate signals causing drive circuit 106 to drive laser module 104 to generate laser light. In other embodiments, switch 130 can comprise a switch that provides power to initiate operation of system controller 108 only when switch 130 is in a position other than the "Off" position.

Other modes of operation are possible. For example a "Stand By" mode of operation can be provided to conserve stored energy of from power supply 118 while maintaining the laser system 100 in an advanced state of readiness for use. For example, when switch 130 is moved to the "Stand By" position user input system 110 can send signals to system controller 108 from which system controller 108 can determine that this mode of operation has been selected.

System controller 108 may also have other modes of operation that activate in response to detected rotation to other positions. For example, system controller 108 may have a "Stand By" mode that can be activated when first housing portion 102A and second housing portion 102B are rotated to another position and can respond to this by sending signals to drive circuit 106 causing drive circuit 106 to begin supplying power circuits or subsystems, if any, that require some time to reach a state where they are ready for immediate activation when switch 130 is moved to the "On" position. Not all circuits or subsystems will need be activated at such times and a "Stand By" option relieves the operator from being confronted with the choice of operating the laser system 100 in a high power consumption "On" mode prior to the need to do so and the choice of holding the device in the "Off" state to conserve power with the understanding that there will be a lag time before activation.

Additionally, in the embodiment of FIGS. 1-3 switch 130 can sense when the relative rotation of first housing portion 102A and second housing portion 102B indicates that laser system 100 is to be operated in a "Test" mode and, when this happens, user input system 110 can send a signal to system controller 108 from which system controller 108 can determine that a "Test" mode is desired. In one example of this type, system controller 108 can cause laser module to emit a laser emission 122 at a lower power than used for other purposes. This lower powered laser emission 122 can be used to allow verification of the operational status of laser system 100 such as by emitting a lower powered laser test beam that can be directed at, for example, nearby targets for training purposes or at target strips or pages that change in appearance when illuminated by the laser in the test mode. Here too, this mode will be entered when system controller 108 receives a signal from user input system 110 indicating that switch 130 has been moved to a position selecting the "Test" mode.

Figure 4:
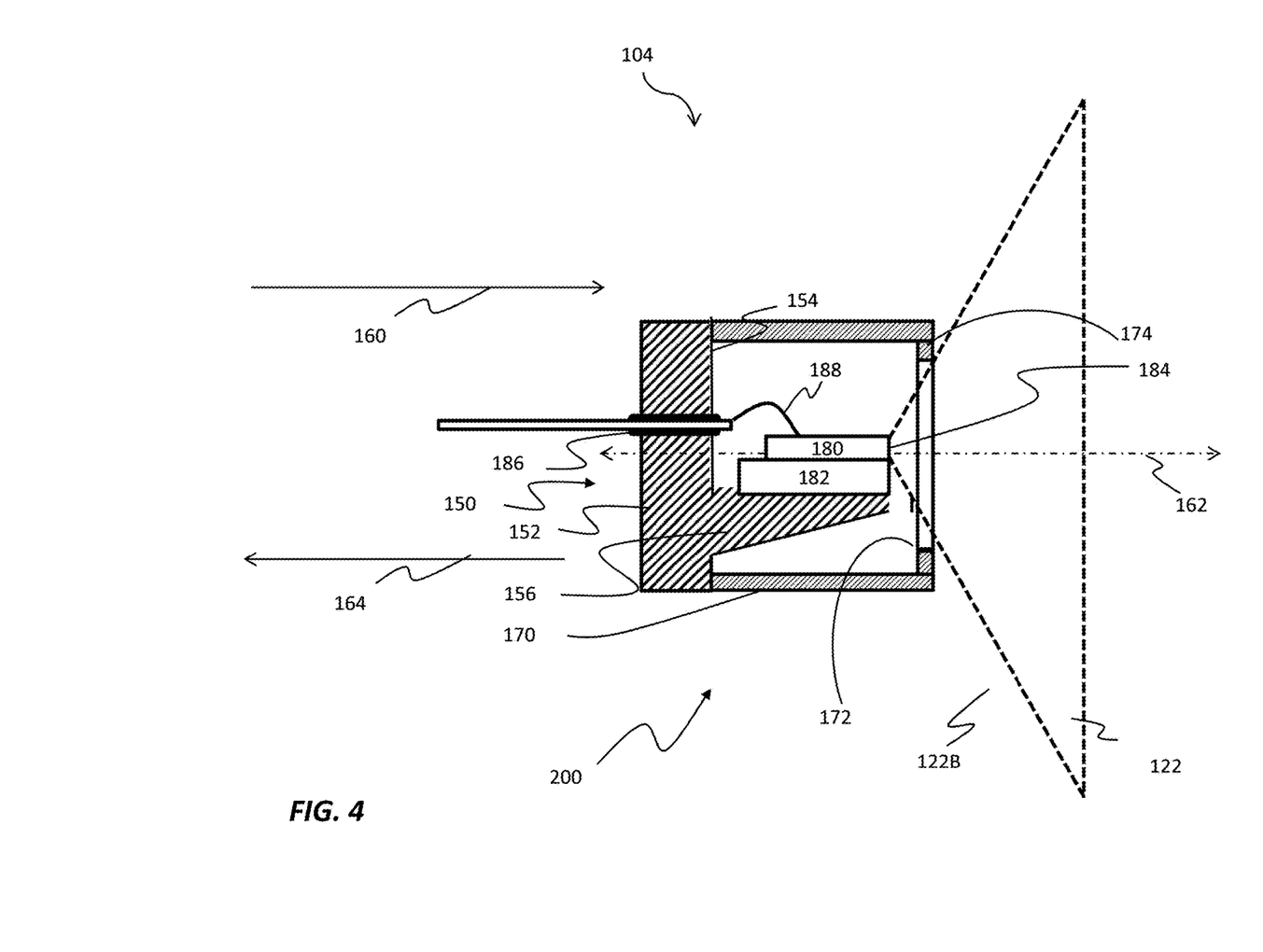
FIG. 4. is a is a cross-section schematic view of one embodiment of a laser module

Turning now to FIG. 4 what is shown is a cross-section schematic view of one embodiment of a laser module 104 taken as shown in FIG. 1. In the embodiment that is illustrated in FIG. 4, laser module 104 has a laser core 150 with a base 152 having a front side 154 from which a header 156 extends in a first direction 160 and a housing 170 shaped to combine with front side 154 to form a sealed environment about header 156.

A semiconductor laser 180 is mounted to header 156. In this embodiment, semiconductor laser 180 is mounted to header 156 by way of a submount 182. Semiconductor laser 180 is also joined to one or more electrical conductor 186 by way of for example a wirebond 188 or other electrical connections so that electrical energy can be supplied to semiconductor laser 180 causing semiconductor laser 180 to emit divergent laser emissions 122. Semiconductor laser 180 is positioned on submount 182 to direct laser emissions 122 from an emission face 184 in first direction 160 through a core window 172 on a front portion 174 of housing 170. Semiconductor laser 180 or submount 182 can be joined to header 156 in any of a variety of ways including conventional fasteners, solders, conductive adhesives and the like. Semiconductor laser 180 in turn is typically bound to submount 182 using soldering techniques, although other techniques are also known.

Semiconductor laser 180 can comprise for example, any semiconductor device that can emit a laser output. Examples of semiconductor laser 180 include but are not limited to a diode laser, quantum cascade lasers, inter-band cascade lasers. These types of semiconductor lasers 180 share generally the characteristics of being made from a semiconductor material and having a emitting a divergent laser light beam while also generating a meaningful amount of heat that must be dissipated to protect semiconductor laser 180.

In the embodiment illustrated in FIG. 4, semiconductor laser 180 emits divergent laser emissions 122 having a wavelength in the infrared region such as between 2µ and 30µ wavelength. However, in other embodiments, semiconductor laser 180 can emit laser emissions 122 having any of a wide range of wavelengths including but not limited to ultraviolet wavelengths, visible wavelengths, and near infrared wavelengths. For the purposes of the following discussion, it will be assumed that in the embodiment of FIG. 4, semiconductor laser 180 is a quantum cascade type laser. Laser emissions 122 from laser system 100 may be highly divergent and spread over a wide range of angles. However, the intensity of the laser emissions 122 may vary according to the position of an observer relative to the laser emitter.

Figure 5:
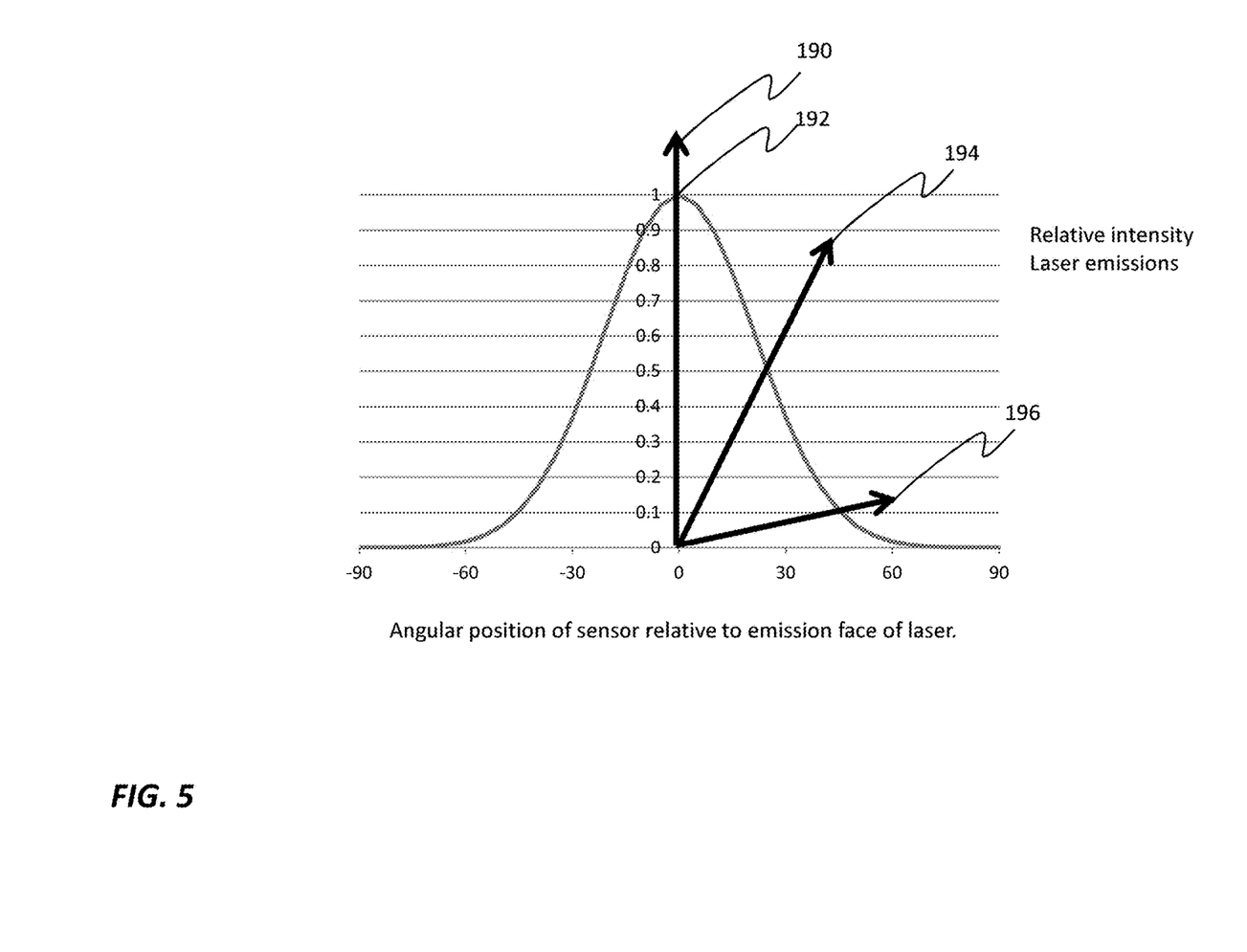
FIG. 5 is a chart showing an emission intensity as a function of angle of view.

FIG. 5 is a chart that illustrates the relative intensities of laser emissions 122 hypothetically observable from semiconductor laser 180. As is shown in FIG. 5, an appropriate sensor (not shown) located along a direction 190 that is normal to emission face 184 of semiconductor laser 180 will sense a highest relative intensity 192 of laser emissions 122. As is also shown in FIG. 5, the relative intensity of sensed laser emissions 122 decreases as such a sensor is used to observe emission face 184 from a direction that is greater or less than normal direction 192. In this example, the relative observable intensity drops to a level that is half of the highest intensity in a half intensity direction 192 that is, in this example, between 25 and 30 degrees 194 from the normal direction 190 and ten percent of the highest relative intensity 192 when the same sensor observes emission face 184 a ten percent direction 196 that is between 30 and 60 degrees away from normal. Other arrangements are possible.

It will be appreciated that it can be difficult for a sensor to discriminate between an infrared signal from a beacon system 100 and background noise when the signal is greatly attenuated such as when the signal is being viewed at an extreme angle relative to emission face 184. Accordingly, beacon system 100 can be said to have a laser emission 122 having a patterned emission 128 with a generally conical shape and for the purpose of the illustration in FIGS. 1 and 2 is shown with sides 128a and 128B illustrated at an angle relative to emission face 184 at which the sensed intensity of a sensed laser emission 122 will be 50% of the perceived intensity of laser emissions 122 if sensed at a position that is normal to emission face 184 with all other sensing conditions being the same. A sensor within the patterned emission 128 will typically be capable of detecting laser emissions 122 more reliably against background noise and environmental conditions that can have the effect of attenuating or scattering laser emission 122.

However, even within this patterned emission 128 it may still be difficult to sense laser emission 122 at long distances. For example, in a search and rescue mission, it may be necessary to sense laser emission 122 using a sensor system mounted to an aircraft flying at a significant altitude, at a high rate of speed and at a significant distance on the order of 1 to 30 km for example. Additionally atmospheric conditions such as dust, smoke, and water vapor and other conditions may attenuate laser emission 122.

One expedient to overcome such communication difficulties is to increase the power of laser emitter 122. However, in many forms of semiconductor lasers 180 there are practical limitations as to the amount of energy that can be passed through such semiconductor lasers, one limitation is the amount of power available as extended periods of operation require power supplies that can be both large and heavy.

Additionally, semiconductor lasers 180 have finite efficiencies with a proportion of the energy supplied to such semiconductor lasers 180 being converted into heat. As the heat increases the temperature of semiconductor laser 180 increases and the efficiency of the semiconductor laser 180 decreases. Accordingly, the temperature of the semiconductor laser must be therefore be maintained. Often this is done using active cooling components such as thermo-electric coolers that themselves require power to operation and therefore increase the burdens on power supply.

Another expedient is to use additional optics to focus the energy emitted by the laser to a narrow pathway. Conventionally, these divergent emissions are then shaped to conform to desired emission patterns, often collimated or partially collimated using optics that are positioned beyond the laser emitter. For example, U.S. Pat. No. 8,723,121, describes an identification system and method using highly collimated source of electromagnetic radiation which emits towards a thermal imaging unit highly directional radiation and provides various examples of collimating optics intended for this purpose. Such collimation concentrates beam energy in a single direction. Such a collimated beam strategy however provides a tightly limited cone of visibility that appears to require that the beacon be aimed or mechanically scanned. The former is problematic in that the beam aiming can be challenging in a variety of situations such as combat, search and rescue, emergency rescue and other situations where the user of a beacon must be capable of doing other things while providing the beacon signal. The latter is problematic in beam scanning solutions add weight, cost and size to a beacon system while also increasing the power consumption of the system during operation.

To address these challenges, a super-pulse laser driving scheme may be used. In a super-pulse driving scheme driver 106 causes high energy bursts of energy to be supplied to semiconductor laser 180 for short pulse lengths within a longer duty cycle. By operating semiconductor laser 180 in such short bursts, semiconductor laser 180 has less time to heat than semiconductor laser 180 would have in the event that it is run in a continuous mode. Further, by separating such short bursts by larger duty cycles semiconductor laser 180 is given time to cool to an extent. This reduces or eliminates the need for active cooling and the battery drain associated therewith while creating pulses of laser emission 122 that are high in intensity.

This superpulse driving scheme therefore is a valuable element involved in providing a laser system 100 that is light weight and yet provides suitable operation. However, issues of size weight and usability are also of importance in providing an overall system that meets desired operational capabilities.

One solution to this problem can be found in the use of semiconductor lasers 180 which, as is discussed generally above, have an emission face 180 emit a divergent laser emission 182 through an emission face 184. For example, and without limitation, where semiconductor laser 180 is a quantum cascade laser, emission face 184 may emit a laser emission 122 having a cone of visibility determined by a divergence of the laser emission from the emission face 184 and by a shape of emission face 184, such as may be determined by an a height and a width of emission face 184 and a divergence of laser emission 122 from emission face 184.

Figure 6A:
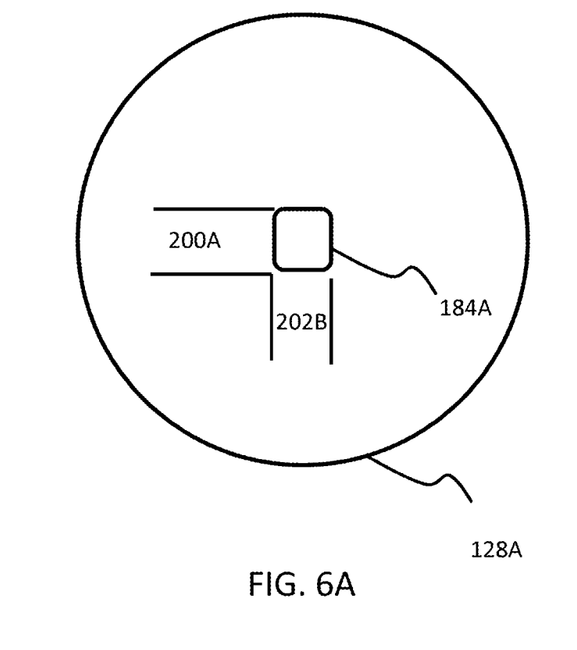
FIGS. 6A, 6B, and 6C show various emission patterns.
Figure 6B:
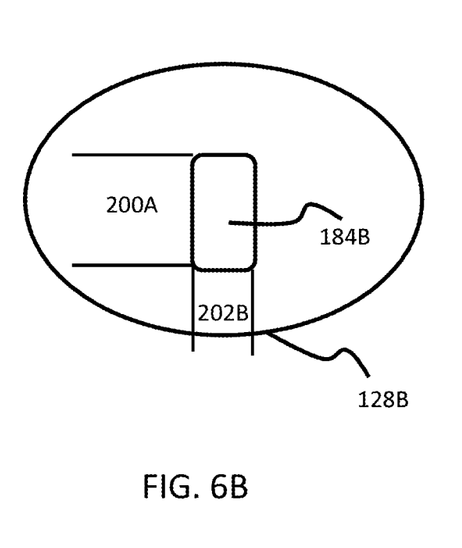
Figure 6C:
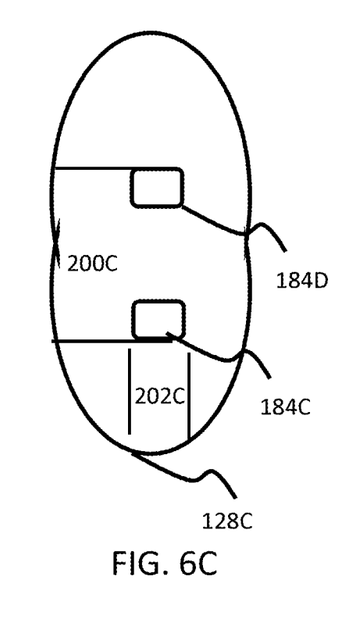

FIG. 6A, 6B, or 6C show circular, ovular, or multi-lobed emission patterns 128A, 128B, and 128C. Centered in circular emission pattern 128A is a representative emission face 184A with an aspect ratio of 1:1, meaning that a height 200A and width 202A of emission face 184A (not to scale) are generally equal. Centered in ovular emission pattern 128B is a representative emission face 184B having a height 200B and width 202B that are not equal. Similarly, centered in dual lobed zone 190C is a multifaceted emission face shown here as a combination of emission faces 184C and 184D having a combined height of 200C and a width of 202C. Adjacent emission faces created by lasers that are positioned proximate to each other may generate laser emissions in a coherent manner or an in-coherent manner. An emission pattern formed from laser light emitted in a coherent fashion may have a different shape than an emission pattern formed from laser light emitted in an in-coherent manner. It will be appreciated from FIGS. 6A, 6B and 6C that the shape of patterned emission 128 may be determined in part based upon the aspect ratio of the emission face 184 and as is shown in FIG. 6C any pattern of combination of emission faces 184C, D.

Additionally, the extent of the divergence of laser emission 122 from emission face 184 is a function of the area of the emission face 184 with emission faces having larger emission areas having lower divergences than emission faces having smaller areas. Accordingly, greater divergence can be achieved through the use of smaller emission faces without the use of shaping optics.

In operation laser driver 106 may be adapted to modulate the super-pulse pattern to create a pattern of emissions over time. This pattern may contain data such as an identification of laser system 100, the operator of laser system 100 or other data that may be encoded in such a signal. Laser driver 106 may also modulate the super-pulse pattern at frequencies between 2 and 10 Hz in order to make the appearance of the pattern more identifiable to human observers. Similarly, laser driver 106 may also modulate the super-pulse pattern at other frequencies or patterns to make the pattern more identifiable to automatic equipment that may be used to locate either laser system 100 or other objects or events that may be sensed using thermal or other types of sensing. Such modulation may be performed in a manner intended to prevent mis-identification of laser emissions 122 as other sources of detected light so as to prevent automatic activation of systems on search equipment such as imaging systems, imager protection systems and other systems that automatically act to protect search drones, aircraft or other systems monitoring the area. Further, such modulation may be user programmable either by way of user interface 110, port 125 or communication system 116.

Returning to FIG. 4, patterned emission 128 from laser system 100 in the present system pass through two windows—system window 134 and core window 172. In the embodiment that is illustrated these windows are not designed to have an impact on the divergence of laser system 100. Instead, by maintaining these windows as pass-through optics (at least as to the laser beam being emitted) and controlling the shape and intensity of the laser being emitted it becomes possible to provide a laser system 100 that is rugged, light weight and efficient as no complex optical schemes are required. Additionally, by requiring beam 100 to pass through less optics there is less loss of intensity of laser emissions 122. Further by providing such components in such a manner relative movement of laser core 150 and window 134 does not significantly impact patterned emission 128.

This allows laser system 100 to be designed in a manner that can utilize an additional degree of freedom of movement that can be utilized to receive user input actions. For example, as is shown housing 102 has a first housing portion 102A and a second housing portion 102B that are joined in a manner that allows rotation of first housing portion 102A and second housing portion 102B relative to each other. To the extent that first housing portion and second housing portion have optics mounted therein that must be precisely aligned with laser emissions 184 such relative motion would raise the risk of creating misalignments or other problems.

Instead as is shown in FIGS. 1-3 relative rotation is possible. Further, in other embodiments, it could become possible to allow sliding motion of first housing portion 102A and second housing portion 102B and to use switch 100 to sense such motion for activating laser system 100. For example in such an embodiment, first housing portion 102A and second housing portion 102B could be arranged to allow second housing portion 102B to at least in part slide into and out of first housing portion 102A with some form of biasing such as a spring or magnet driving first housing portion into a distal position where laser system 100 is determined to be off. In such an embodiment pressing second housing portion 102B into a proximate position is detected by a switch such as switch 130 and signals from switch 130 are passed along to cause laser emissions from laser system 100. Alternatively a tap on/tap off strategy can be used.

It will be appreciated that the ability to use first housing portion 102A and second housing portion 102B in this way limits number openings between the sensitive components of laser system 100 and the outside world, reducing the number of seals that may be penetrated by external contaminants while still providing a useful interface.

Port 125 is optional and provides an access point for external power supplies for recharging power supply 118 and for connecting power supply 118 to supplemental power sources. It will be appreciated from this that port 125 can be connected to a power supply 118 that is external to housing 102.

An optional mounting structure 140 is shown in FIG. 2. In the embodiment that is shown in FIG. 2, mounting structure 140 comprises a conformal layer of material conformal and may conform to the shape of a shoulder or other body part or to protective gear such as a helmet. Mounting structure 140 may also take the form of a rigid structure or semi-rigid structure mountable to equipment.

Also shown in FIG. 2 in phantom is an activation display 131, which may take the form of a light an LCD or any other form of user output that may indicate an operational state of laser system 100. Placement in this area allows light emitting types of display to be hidden between the mounting structure 140 and the object to which it is mounted so that such displays are not visible other than when being checked.

In embodiments, it may be desirable to automatically activate laser system 100 when certain events occur. For example, during an ejection from a moving aircraft, it may be desirable for laser system 100 to automatically activate either at the moment of ejection or at the moment of landing. In certain embodiments, sensors 112 can include an accelerometer that can be used to detect accelerations or acceleration patterns associated with events such as ejection or landing. Similarly, other acceleration events can be modeled.

In embodiments, activation may be automatic with deactivation and re-activation being done after landing or at the end of the acceleration event.

It will also be appreciated that there is a risk that laser system 100 may be captured or otherwise obtained by unfriendly forces or others who may use the device to create false signals. To prevent this, in one embodiment, there may be no indication that rotation or other motion of first housing portion 102A relative to second housing portion 102B will activate system 100 to cause a laser emission. Additionally or alternatively, relative motion of first housing portion 102a and second housing portion 102B can be arranged so that a predetermined combination of more than one such motion is required in order to cause emission of patterned laser emissions 128.

The invention has been described in detail with particular reference to certain preferred embodiments thereof, but it will be understood that variations and modifications can be effected within the spirit and scope of the invention.

What is claimed is:

1. A laser system comprising:
   a semiconductor laser having an emission face;
   a drive circuit adapted to supply electric energy to the semiconductor laser to cause the semiconductor laser to emit a beam;
   a user input system adapted to sense a user input action;
   a controller adapted to control the drive circuit based upon the sensed user input action; and
   a housing within which the semiconductor laser, drive circuit, user input system and controller are positioned, the housing having an opening with a window disposed on an outermost surface of the housing and through which the semiconductor laser can emit the beam; wherein:
   the semiconductor laser is positioned to emit the beam through the window such that the beam exits the housing without passing through beam shaping optics, and
   the emission face of the semiconductor laser is sized to cause a divergence in the beam to create a patterned emission with a predetermined shape without passing the beam through beam shaping optics.

2. The laser system of claim 1, wherein the optical window has no optical power.

3. The laser system of claim 1, wherein the emission face comprises a central axis, and the semiconductor laser is connected to a portion of the housing configured to rotate the semiconductor laser about the central axis, the emission face having a size that creates a divergence in the beam, the divergence in the beam being such that rotation of the semiconductor laser about the central axis relative to the window does not significantly impact the shape of the patterned emission.

4. The laser system of claim 1, further comprising a laser core having a header on which the semiconductor laser is positioned, a base joined to the header and a housing joined to the base to form a sealed environment around the header and semiconductor laser, with the header positioning the emission face to emit the beam through an opening in the header and the window, and wherein the emission face has an area that creates a divergence in the beam that creates the patterned emission with a shape that is not significantly impacted by relative movement of the laser core and the window.

5. The laser system of claim 1, wherein the emission face has a size that is defined by a height and a width and wherein the shape of the emitted beam is at least in part determined by a ratio of the height of the emission face to the width of the emission face.

6. The laser system of claim 1, further comprising a second semiconductor laser with a second emission face having a size and wherein the shape of the patterned emission is determined based upon the size of the emission face, the size of the second emission face, and a positioning of the first semiconductor laser with respect to the second semiconductor laser.

7. The laser system of claim 1, further comprising a second semiconductor laser with a second emission face having a shape and wherein the shape of the patterned emission is determined based upon the shape of the emission face of the first semiconductor laser, the shape of the emission face of the second semiconductor laser and a positioning of the first semiconductor laser with respect to the second semiconductor laser.

8. The laser system of claim 1, wherein the emission face has a further comprising a second semiconductor laser with a second emission face having an aspect ratio and wherein the shape of the patterned emission is determined in part by the aspect ratio of the emission face, the aspect ratio of the second emission face and a positioning of the first semiconductor laser with respect to the second semiconductor laser.

9. The laser system of claim 1, further comprising an accelerometer disposed within the housing and adapted to sense accelerations of the laser system, wherein the controller is adapted to monitor the sensed accelerations and determine an operating mode of the laser system based upon the sensed accelerations.

10. A laser system comprising:
a semiconductor laser having an emission face;
a drive circuit adapted to supply electric energy to the semiconductor laser to cause the semiconductor laser to emit a beam;
a user input system adapted to sense a user input action;
a controller adapted to control the drive circuit based upon the sensed user input action;
a housing having:
a first housing part within which at least the semiconductor laser is positioned, and
a second housing part joined to the first housing part, the second housing part having a housing window through which the beam can pass;
wherein first housing part is movable within a range of positions relative to the second housing part and wherein the emission face of the semiconductor laser has an area that causes a divergence in the beam that creates a patterned emission with a predetermined shape that does not substantially change with relative movement of the first housing part and the second housing part and without passing the beam through beam shaping optics.

11. The laser system of claim 10, wherein the first housing part is movable within an range of positions relative to the second housing part with such movement causing relative movement of the emission face and the window and wherein the emission face has an area that creates a divergence in the beam that allows relative movement of the emission face and the window without significantly impacting the shape of the patterned emission.

12. The laser system of claim 10, wherein the sensed user input action is relative movement of the first housing part and the second housing part.

13. The laser system of claim 10, wherein the laser system can emit the patterned beam having the shape with greater efficiency than an alternate laser system using beam shaping optics.

14. The laser system of claim 10, further comprising an accelerometer adapted to sense accelerations of the laser system, wherein the controller is adapted to monitor the sensed accelerations and determine an operating mode of the laser system based upon the sensed accelerations.

15. The laser system of claim 10, wherein the first housing part and the second housing part are adapted for relative movement by sliding motion.

16. The laser system of claim 10, wherein the first housing part is engaged to the second housing part using a threaded interaction such that rotation of the first housing part relative to the second housing part causes a change in the relative positions of the emission face and the window.

17. The laser system of claim 10, wherein the laser system has a mounting structure adapted to be joined to another object and wherein an indicator is positioned within the mounting structure such that it is hidden between the housing, the mounting structure and an object to which the laser system is joined.

18. The laser system of claim 1, wherein at least part of the housing is sealed so as to substantially prohibit air-born contaminants from entering the at least part of the housing, and wherein the semiconductor laser is disposed within the at least part of the housing.

19. The laser system of claim 1, wherein the input system includes a sensor configured to detect a user input action, and to provide a signal to the controller indicative of the user input action.

20. The laser system of claim 1, further comprising a user output system, a communication system, and a power supply disposed within the housing.

* * * * *